(12) United States Patent
Najafi et al.

(10) Patent No.: US 11,980,105 B2
(45) Date of Patent: May 7, 2024

(54) SUPERCONDUCTING SWITCH

(71) Applicants:PsiQuantum Corp., Palo Alto, CA (US); Government of the United States of America, as Represented by the Secretary of Commerce, Washington, DC (US)

(72) Inventors: Faraz Najafi, Palo Alto, CA (US); Qiaodan Jin Stone, Sunnyvale, CA (US); Adam Nykoruk McCaughan, Denver, CO (US)

(73) Assignees: PSIQUANTUM CORP., Palo Alto, CA (US); Government of the United States of America, as Represented by the Secretary of Commerce, Washington, DC (US)

( * ) Notice: Subject to any disclaimer, the term of this patent is extended or adjusted under 35 U.S.C. 154(b) by 404 days.

(21) Appl. No.: 17/240,965

(22) Filed: Apr. 26, 2021

(65) Prior Publication Data

US 2021/0249583 A1 Aug. 12, 2021

Related U.S. Application Data

(63) Continuation of application No. PCT/US2019/057990, filed on Oct. 25, 2019.
(Continued)

(51) Int. Cl.
*H01F 6/04* (2006.01)
*H10N 60/30* (2023.01)
*H10N 60/84* (2023.01)

(52) U.S. Cl.
CPC .............. *H10N 60/30* (2023.02); *H01F 6/04* (2013.01); *H10N 60/84* (2023.02)

(58) Field of Classification Search
CPC .......... H01N 60/30; H01N 60/84; H01F 6/04
See application file for complete search history.

(56) References Cited

U.S. PATENT DOCUMENTS 4,869,598 A * 9/1989 McDonald ............. H10N 60/84
 374/176
5,026,682 A 6/1991 Clark et al.
(Continued)

FOREIGN PATENT DOCUMENTS

EP 1965184 A1 9/2008
JP H0555647 A 3/1993

OTHER PUBLICATIONS

PsiQuantum, International Search Report/Written Opinion, PCT/US19/57990, dated Jul. 15, 2020, 10 pages.
(Continued)

*Primary Examiner* — Adolf D Berhane
(74) *Attorney, Agent, or Firm* — Morgan, Lewis & Bockius LLP

(57) ABSTRACT

The various embodiments described herein include methods, devices, and systems for operating superconducting circuits. In one aspect, an electric circuit includes: (1) a superconductor component having a first terminal at a first end and a second terminal at a second end; (2) a gate component thermally-coupled to the superconductor component at a first location between the first terminal and the second terminal, where the gate component is thermally-coupled via a first section of the gate component; and where the gate component has a smallest width at the first section so as to focus resistive heating toward the superconductor component.

21 Claims, 9 Drawing Sheets

Related U.S. Application Data

(60) Provisional application No. 62/751,591, filed on Oct. 27, 2018.

(56) References Cited

U.S. PATENT DOCUMENTS

| | | | |
|---|---|---|---|
| 5,053,383 | A | 10/1991 | Short et al. |
| 5,219,826 | A | 6/1993 | Kapitulnik |
| 5,925,892 | A | 7/1999 | Mizuno et al. |
| 10,461,445 | B2 | 10/2019 | Najafi et al. |
| 11,108,172 | B2 | 8/2021 | Najafi et al. |
| 11,380,731 | B1 * | 7/2022 | Najafi .................. H10N 60/84 |
| 11,569,816 | B1 * | 1/2023 | Najafi .................. H10N 60/35 |
| 2004/0088289 | A1 | 5/2004 | Xu et al. |
| 2010/0026447 | A1 | 2/2010 | Keefe et al. |
| 2015/0179916 | A1 | 6/2015 | Pramanik et al. |
| 2016/0249116 | A1 | 8/2016 | Harb |
| 2019/0027672 | A1 | 1/2019 | Megrant |
| 2019/0035999 | A1 | 1/2019 | Najafi |
| 2019/0109595 | A1 | 4/2019 | Najafi |
| 2021/0144442 | A1 | 5/2021 | Liu et al. |
| 2022/0231435 | A1 | 7/2022 | Najafi et al. |

OTHER PUBLICATIONS

PsiQuantum, International Preliminary Report on Patentability, PCT/US19/57990, dated Apr. 27, 2021, 8 pages.

PsiQuantum Corp., PCT/US2018/060802, International Search Report and Written Opinion, Jan. 31, 2019, 19 pages.

PsiQuantum Corp., PCT/US2018/060802, International Preliminary Report on Patentability, May 19, 2020, 13 pages.

Najafi et al., U.S. Appl. No. 16/136,124, Non-Final Office Action, Apr. 4, 2019, 9 pgs.

Najafi et al., U.S. Appl. No. 16/136,124, Notice of Allowance, Jun. 27, 2019, 8 pgs.

Najafi et al., U.S. Appl. No. 16/664,716, Non-Final Office Action, Apr. 1, 2020, 15 pgs.

Najafi et al., U.S. Appl. No. 16/664,716, Final Office Action, Oct. 16, 2020, 14 pgs.

Najafi et al., U.S. Appl. No. 16/664,716, Notice of Allowance, Jan. 28, 2021, 8 pgs.

Najafi et al., U.S. Appl. No. 16/664,716, Notice of Allowance, Apr. 21, 2021, 9 pgs.

* cited by examiner

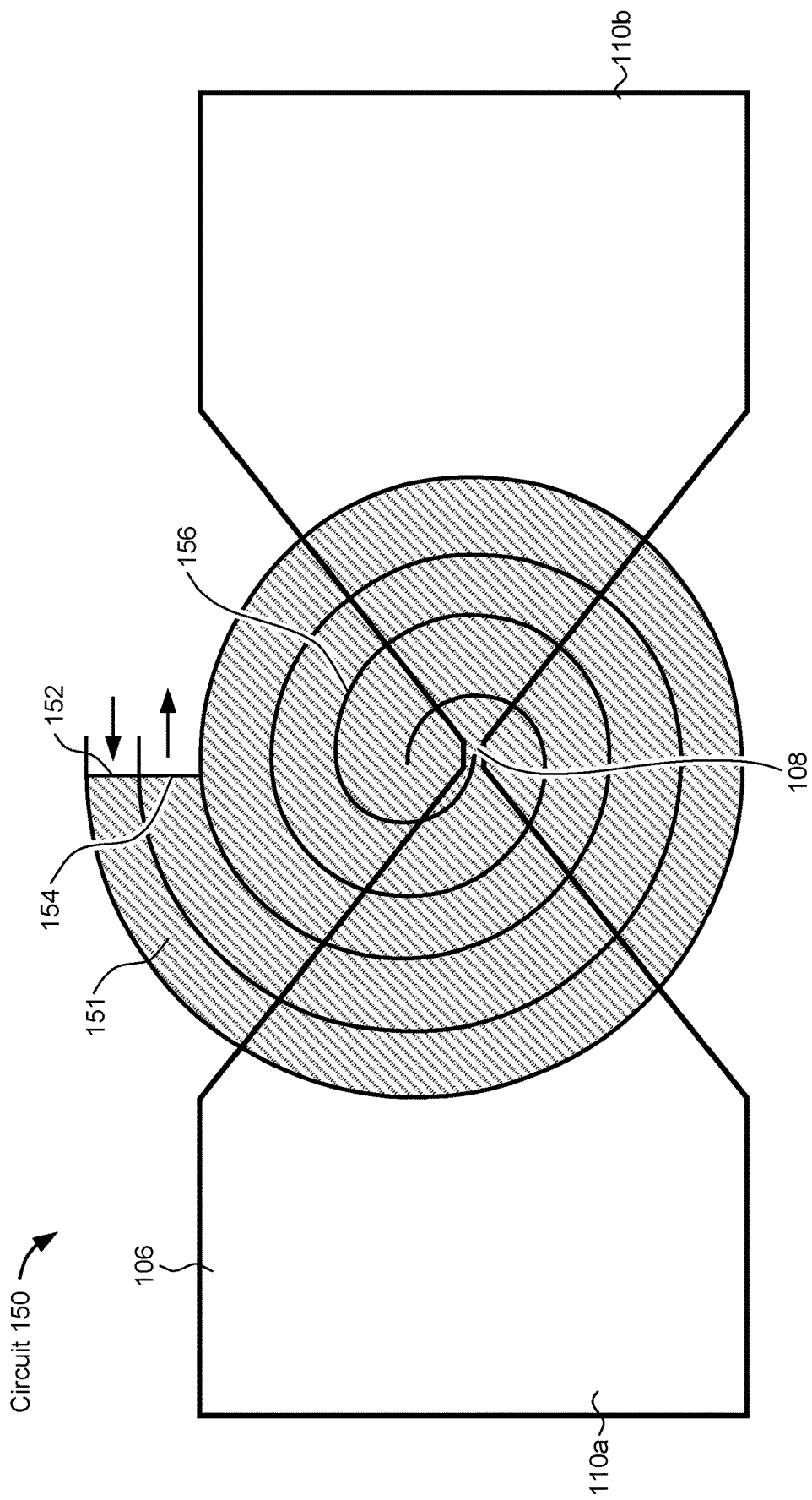

SUPERCONDUCTING SWITCH

RELATED APPLICATIONS

This application is a continuation of PCT Patent Application PCT/US2019/057990, filed Oct. 25, 2019, which claims priority to U.S. Provisional Patent Application No. 62/751,591, filed Oct. 27, 2018, each of which is hereby incorporated by reference in its entirety.

TECHNICAL FIELD

This relates generally to superconducting devices, including but not limited to, superconductor-based switch devices.

BACKGROUND

Impedance is a measure of the opposition to current flow in an electrical circuit. Superconductors are materials capable of operating in a superconducting state with zero electrical resistance under particular conditions. Additionally, in some circumstances, superconductors have high impedance while in a non-superconducting state. Moreover, the superconductors generate heat when operating in a non-superconducting state, and when transitioning from a superconducting state to a non-superconducting state in some circumstances.

Metals and other materials with non-zero resistance generate resistive heat when a current flows through them. The amount of heat generated is based on a current density, and thus is based on a width of a wire carrying the current in some circumstances.

SUMMARY

There is a need for systems and/or devices with more efficient and effective methods for switching superconductor-based devices. Such systems, devices, and methods optionally complement or replace conventional systems, devices, and methods for switching superconductor-based devices.

In one aspect, some embodiments include an electric circuit that includes: (1) a superconductor component having a first terminal at a first end and a second terminal at a second end; and (2) a gate component thermally-coupled to the superconductor component at a first location between the first terminal and the second terminal, wherein the gate component is thermally-coupled via a first section of the gate component. In some embodiments, the gate component has a smallest width at the first section so as to focus resistive heating toward the superconductor component. In some embodiments, the electric circuit is configured such that the superconductor component transitions from a superconducting state to a non-superconducting state in response to heat from the gate component.

Thus, devices and circuits are provided with methods for operating superconductor components, thereby increasing the effectiveness, efficiency, and user satisfaction with such circuits and devices.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

FIG. 5 is a plan diagram illustrating another representative circuit in accordance with some embodiments.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

Figure 1A:
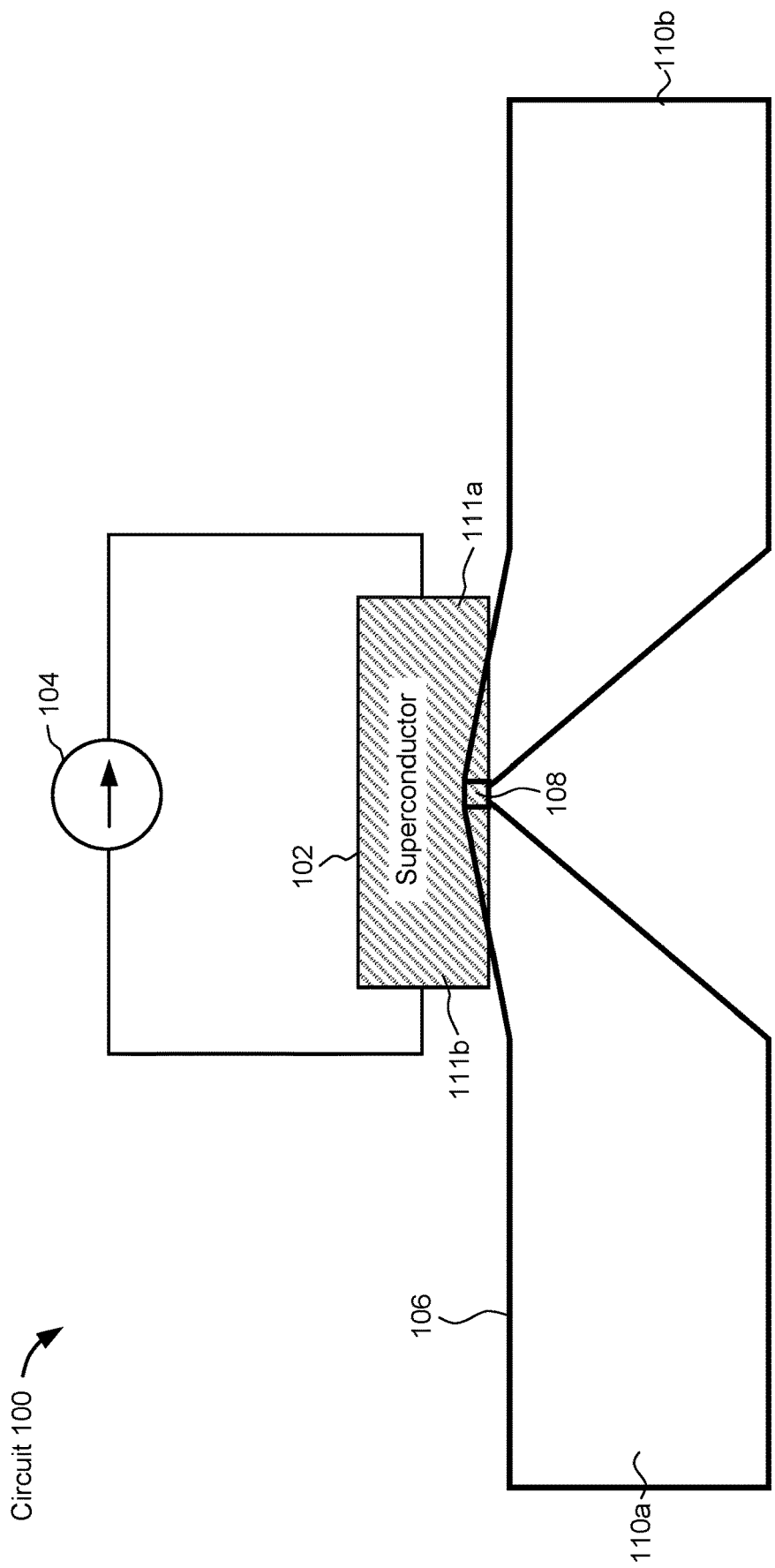
FIG. 1A is a plan diagram illustrating a representative circuit in accordance with some embodiments.

FIG. 1A is a plan diagram illustrating a circuit 100 in accordance with some embodiments. The circuit 100 includes a superconductor component 102 coupled to a current source 104. The superconductor component has a first end 111a corresponding to a source and a second end 111b corresponding to a drain. The circuit 100 further includes a gate component 106 thermally-coupled to the superconductor component 102 via a thin section 108, e.g., having a width in the range of 1 nanometer (nm) to 100 nm. In some embodiments, as described in greater detail below, a current across the gate component controls an impedance between the source and drain of the superconductor component 102. In some embodiments, the current source 104 is configured to supply a first current that is less than a threshold superconducting current for the superconductor component 102. In some embodiments, the current source is adapted to maintain the superconductor component 102 in a superconducting state in the absence of heat from the gate component 106. In some embodiments, the superconductor component 102 has a width in the range of 100 nm to 50 microns.

In some embodiments, the gate component 106 is composed of a metal or semiconductor material. In some embodiments, the gate component 106 is not a superconductor, e.g., has a non-zero resistance. In accordance with some embodiments, the gate component 106 has a tapered section on either side of the thin section 108. In some embodiments, gate component 106 is resistive. In some embodiments, a current is passed from a gate in portion 110a of gate component 106 to a gate out portion 110b of gate component 106, which generates resistive heat.

In some embodiments, the superconductor component 102 is further coupled to an output component (not shown). In some embodiments, the output component is a non-superconductor and is coupled with the superconductor component 102 (e.g., in parallel). In some embodiments, while the superconductor component 102 is in a superconducting state, less than a threshold amount of current from the current source 104 flows to the output component (e.g., the output component has a non-zero resistance). In some embodiments, while the superconductor component 102 is in a non-superconducting state (e.g., a conductive or insulating state), more than a threshold amount of current from the current source 104 flows to the output component (e.g., the output component has less resistance than a resistance of the superconductor component while it is in the non-superconducting state).

Figure 1B:
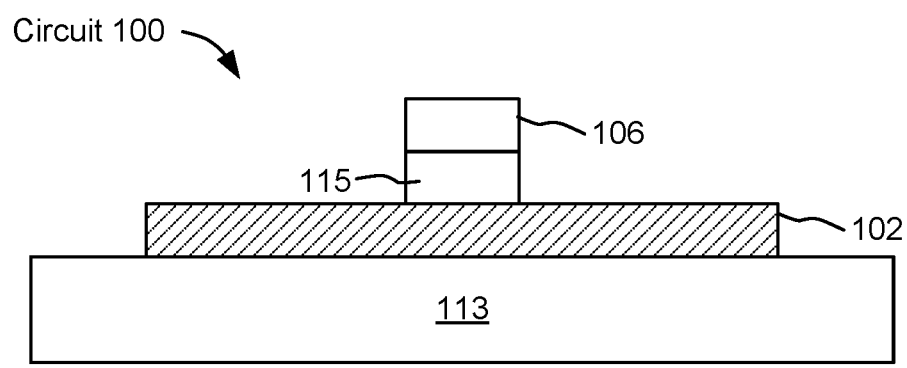
FIG. 1B illustrates a cross-sectional view of circuit 100, in accordance with some embodiments.

FIG. 1B illustrates a cross-sectional view of circuit 100, in accordance with some embodiments. As shown in FIG. 1B n some embodiments, the components of circuit 100 are integrated on a substrate 113. In some embodiments, the circuit 100 includes a first layer with the superconductor component 102 and a second layer with the gate component 106. In some embodiments, the first and second layers are vertically stacked with a coupling layer 115 in between. In some embodiments, the coupling layer 115 is composed of a thermally-conductive, electrically-insulating material (e.g., the coupling layer 115 comprises a thermal coupling component (e.g., an electrically-insulating, thermally-conductive coupling component)).

Figure 2A:
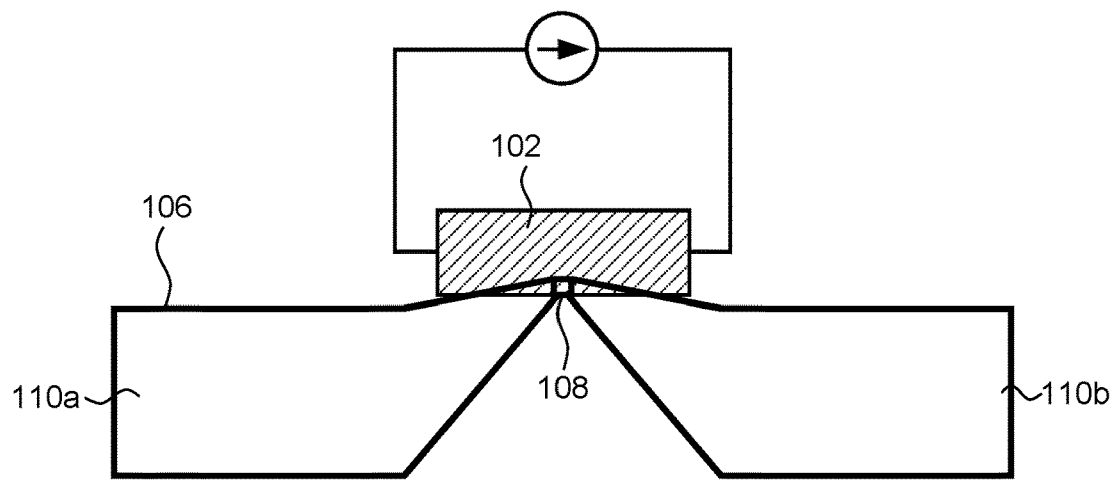
FIGS. 2A-2C illustrate a prophetic operating sequence of the circuit of FIGS. 1A-1B in accordance with some embodiments.
Figure 2B:
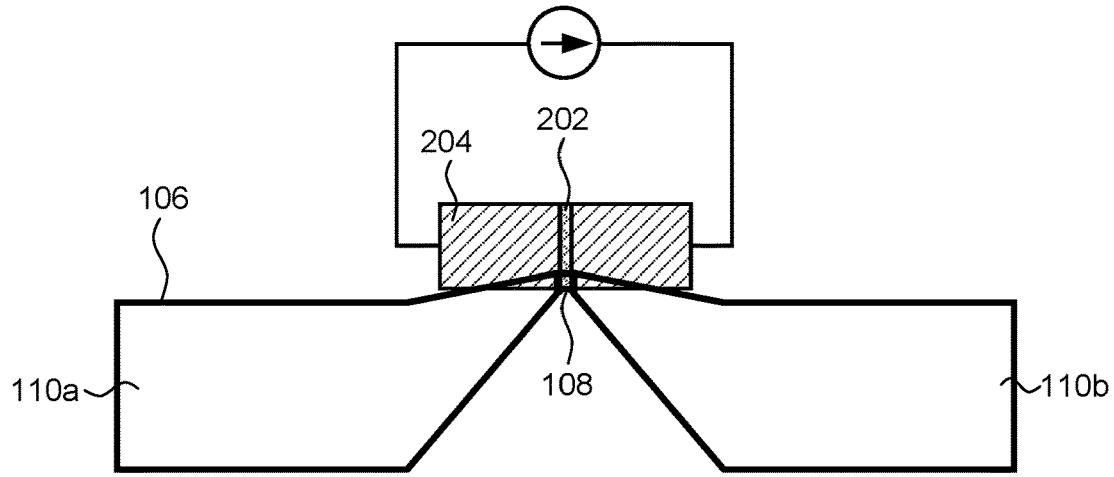
Figure 2C:
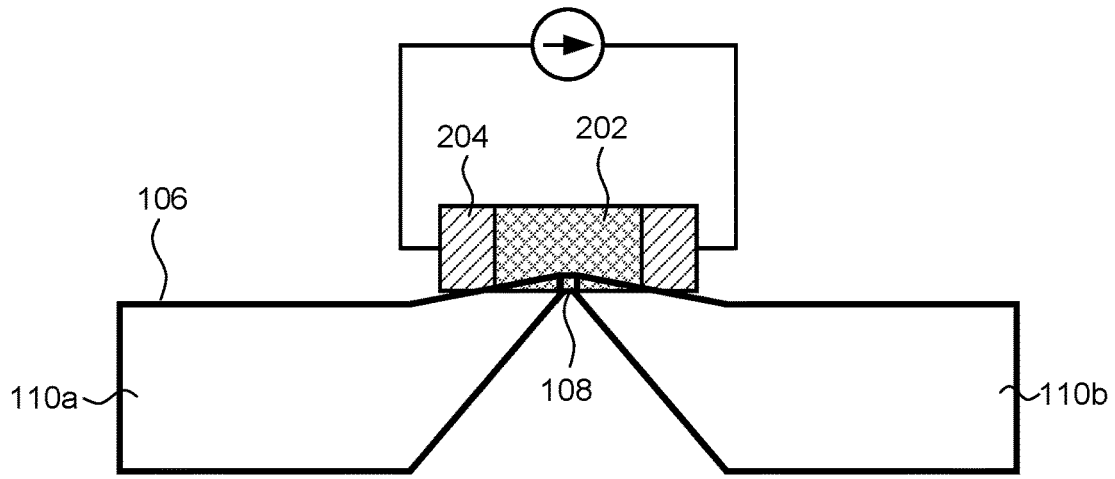

FIGS. 2A-2C illustrates a prophetic operating sequence of the circuit of FIGS. 1A-1B in accordance with some embodiments. FIG. 2A shows the circuit 100 at a first time with no heat being generated by the thin section 108 of the gate component 106. FIG. 2B shows the circuit at a second time with heat being generated by thin section 108 of the gate component 106 and causing a proximate portion (e.g., non-superconducting portion 202) of the superconductor component 102 to transition from the superconducting state to a non-superconducting state. Note that, throughout the figures, portions of a superconductor material operating in a non-superconducting state (also referred to as a "normal" state) are depicted with a cross-hatched pattern, whereas portions of a superconductor material operating in a superconducting state are depicted using a hatch pattern with parallel lines. For example, as shown in FIG. 2B, a complementary portion 204 of superconductor component 102 remains in a superconducting state. In some embodiments, the proximate portion (e.g., non-superconducting portion 202) has a length equal to the width of the superconductor component 102 and a width between 5 nm and 20 nm. In some embodiments, the heat transferred from the thin section 108 exceeds a superconducting threshold temperature of the superconductor component 102, thereby causing the superconductor component to transition to the non-superconducting state. In some embodiments, the heat transferred from the thin section 108 lowers a superconducting threshold current of the superconductor component 102 such that the current supplied by the current source 104 exceeds the lowered superconducting threshold current, thereby causing the superconductor component to transition to the non-superconducting state. FIG. 2C shows the circuit at a third time, after the second time, where the non-superconducting portion 202 of the superconductor component 102 has expanded, e.g., due to self-heating and thermal-conductivity of the superconductor component 102. The self-heating is heating generated by the superconductor component itself as current flows through the non-superconducting portion 202.

Figure 3:
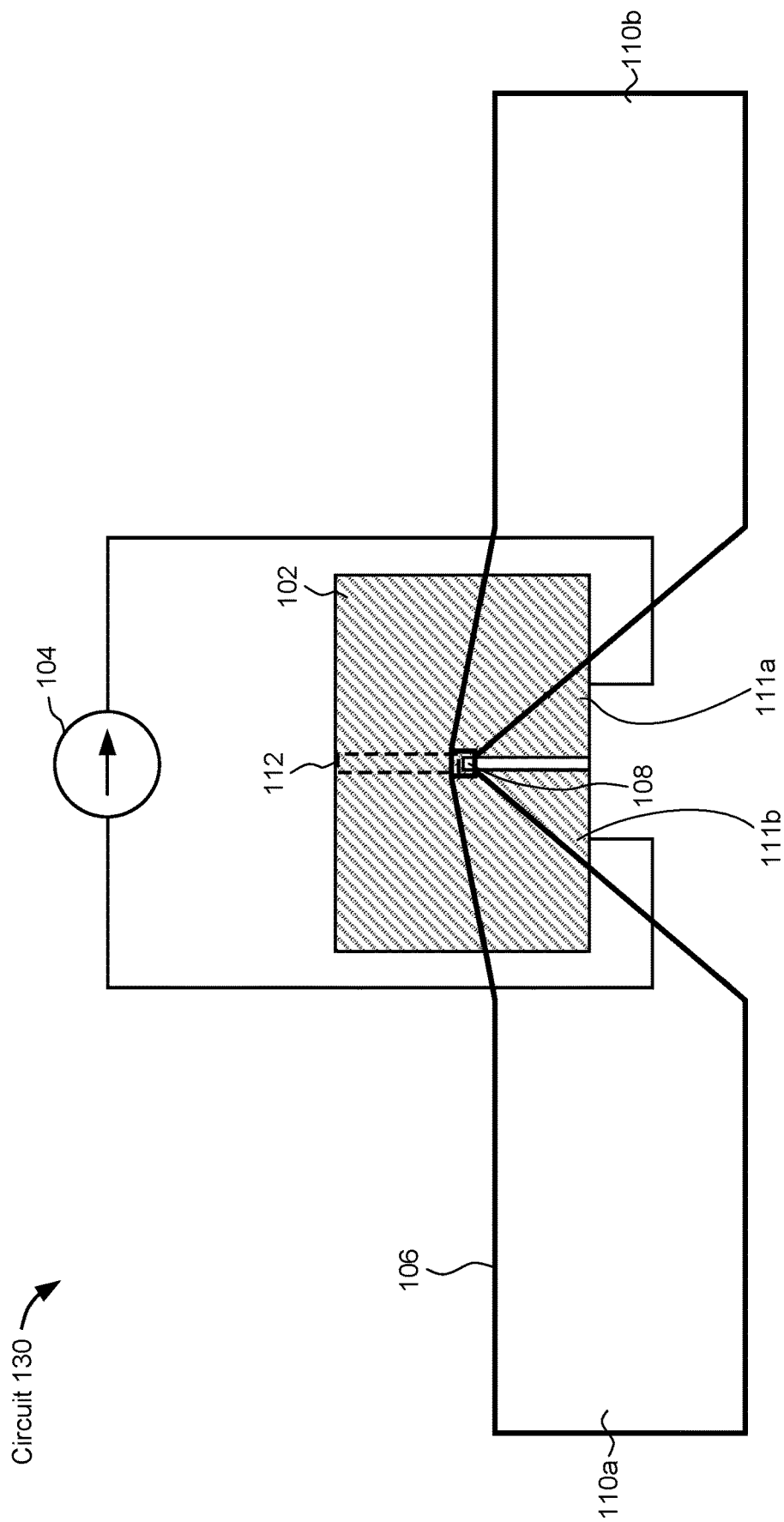
FIG. 3 is a plan diagram illustrating another representative circuit in accordance with some embodiments.

FIG. 3 is a plan diagram illustrating a circuit 130 in accordance with some embodiments. The circuit 130 is similar to the circuit 100 of FIGS. 1A-1B, except that the superconductor component 102 has a constricted region 112 (e.g., due to a cutout or slit in the superconductor component 102). The thin section 108 of the gate component 106 is proximate to the constricted region 112 of the superconductor component 102. The constricted region 112 has a higher current density than other regions of the superconductor component 102. In particular, the portion of the constricted region 112 at the top of the slit experiences current crowding effects as the current supplied by the current source 104 bends around the slit. The current crowding/higher current density in the constricted region 112 results in the constricted region 112 being closer to a superconducting current threshold of the superconductor component 102 (as compared to other portions of the superconductor component 102). Therefore, less heat is required to cause the constricted region 112 to transition to the non-superconducting state (as compared to other portions of the superconductor component 102).

Figure 4A:
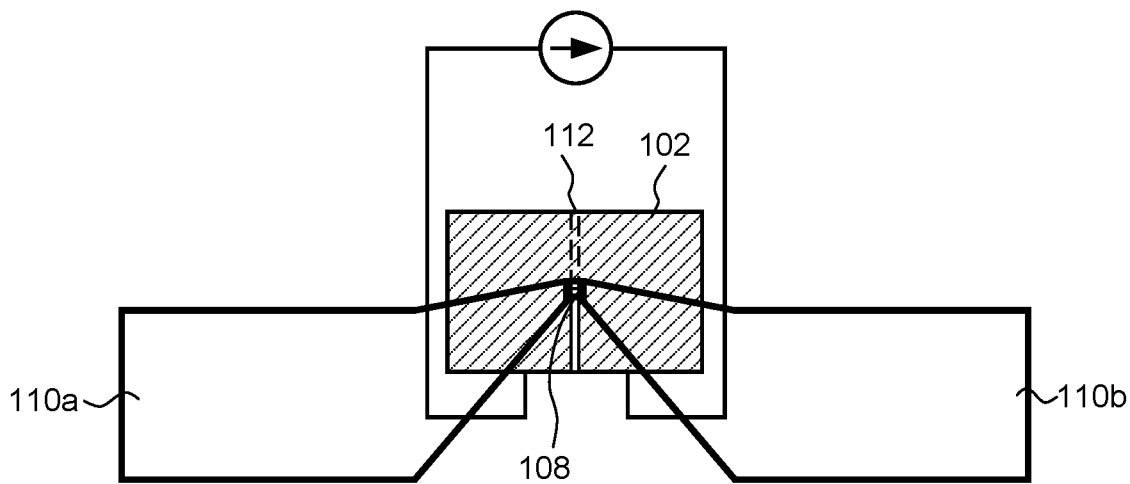
FIGS. 4A-4C illustrate a prophetic operating sequence of the circuit of FIG. 3 in accordance with some embodiments.
Figure 4B:
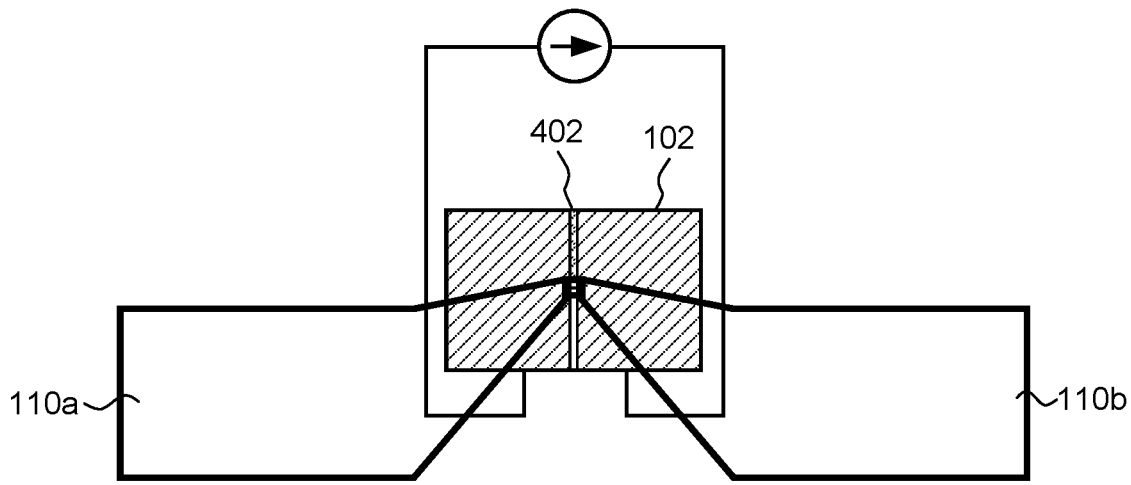
Figure 4C:
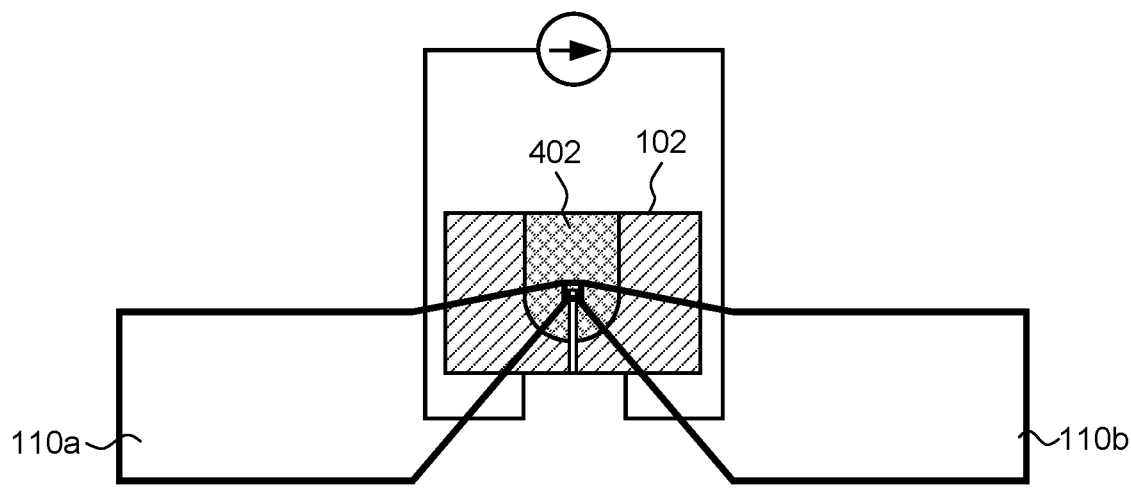

FIGS. 4A-4C illustrates a prophetic operating sequence of the circuit of FIG. 3 in accordance with some embodiments. FIG. 4A shows the circuit 130 at a first time with no heat being generated by the thin section 108 of the gate component 106. FIG. 4B shows the circuit at a second time (e.g., after the first time) with heat being generated by the thin section 108 of the gate component 106 and causing the constricted region 112 of the superconductor component 102 to transition from the superconducting state to a non-superconducting state.

In some embodiments, the heat transferred from the thin section 108 exceeds a superconducting threshold temperature of the constricted region 112, thereby causing a portion of the superconductor component 102, proximal to the constricted region 112, to transition to the non-superconducting state (e.g., non-superconducting portion 402). In some embodiments, the heat transferred from the thin section 108 lowers a superconducting threshold current of the constricted region 112 such that the current supplied by the current source 104 exceeds the lowered superconducting threshold current, thereby causing the constricted region 112 to transition to the non-superconducting state. FIG. 4C shows the circuit at a third time, after the second time, where the non-superconducting portion 402 of the superconductor component 102 has expanded beyond the constricted region 112, e.g., due to self-heating and thermal-conductivity of the superconductor component 102.

FIG. 5 is a plan diagram illustrating a circuit 150 in accordance with some embodiments. The circuit 150 includes a superconductor component 151 having a spiral shape. The superconductor component 151 includes a first terminal 152 and a second terminal 154 (e.g., coupled to the current source 104 shown in FIGS. 1A-1B). The circuit 150 further includes the gate component 106 with the thin section 108. The circuit 150 is arranged such that the thin section 108 is in proximity with an end of the slit (cutout) 156 in the superconductor component 151. In some embodiments, the slit 156 has a width in the range of 100 nm to 50 microns. As described above with respect to FIG. 3, the end of the slit 156 results in current crowding in the proximate portion of the superconductor component 151. Thus, less heat is required to cause the proximate portion of the superconductor component 151 to transition to the non-superconducting state. In some embodiments, the superconductor component 151 has a width in the range of 100 nm to 50 microns.

Figure 6A:
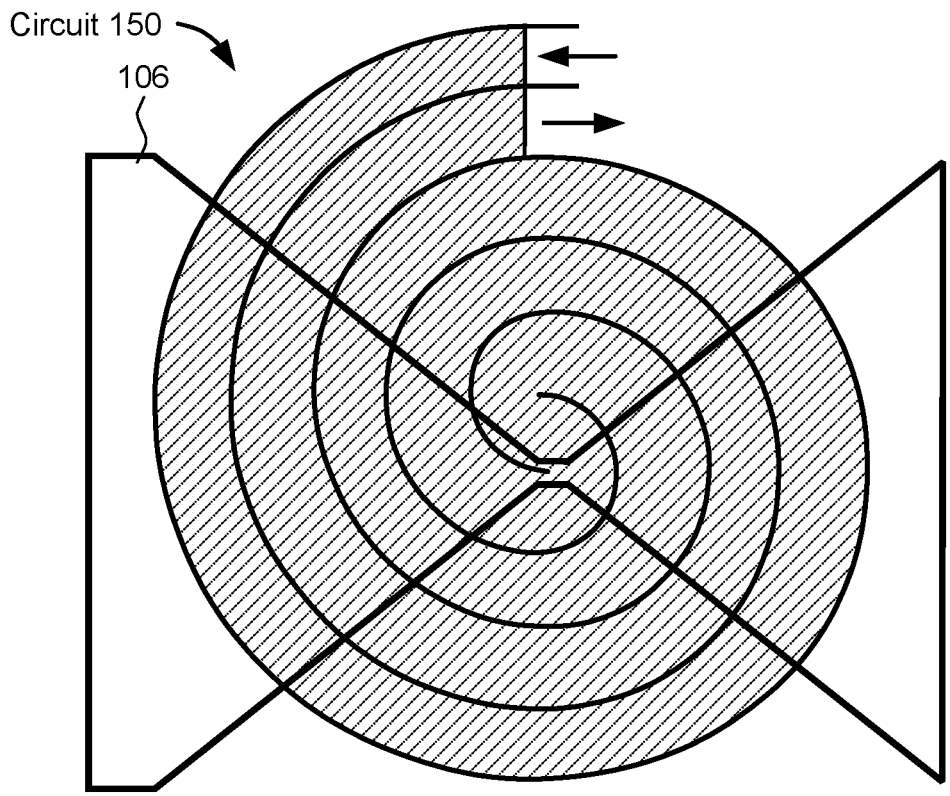
FIGS. 6A-6D illustrate a prophetic operating sequence of the circuit of FIG. 5 in accordance with some embodiments.
Figure 6B:
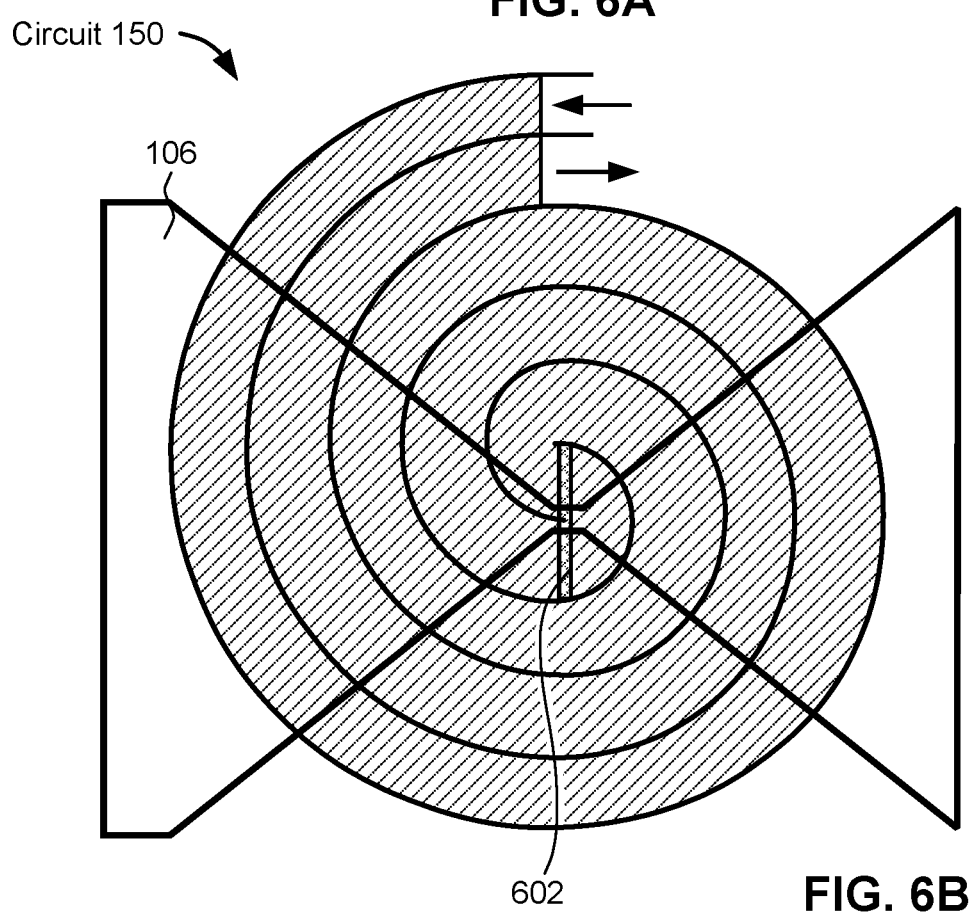
Figure 6C:
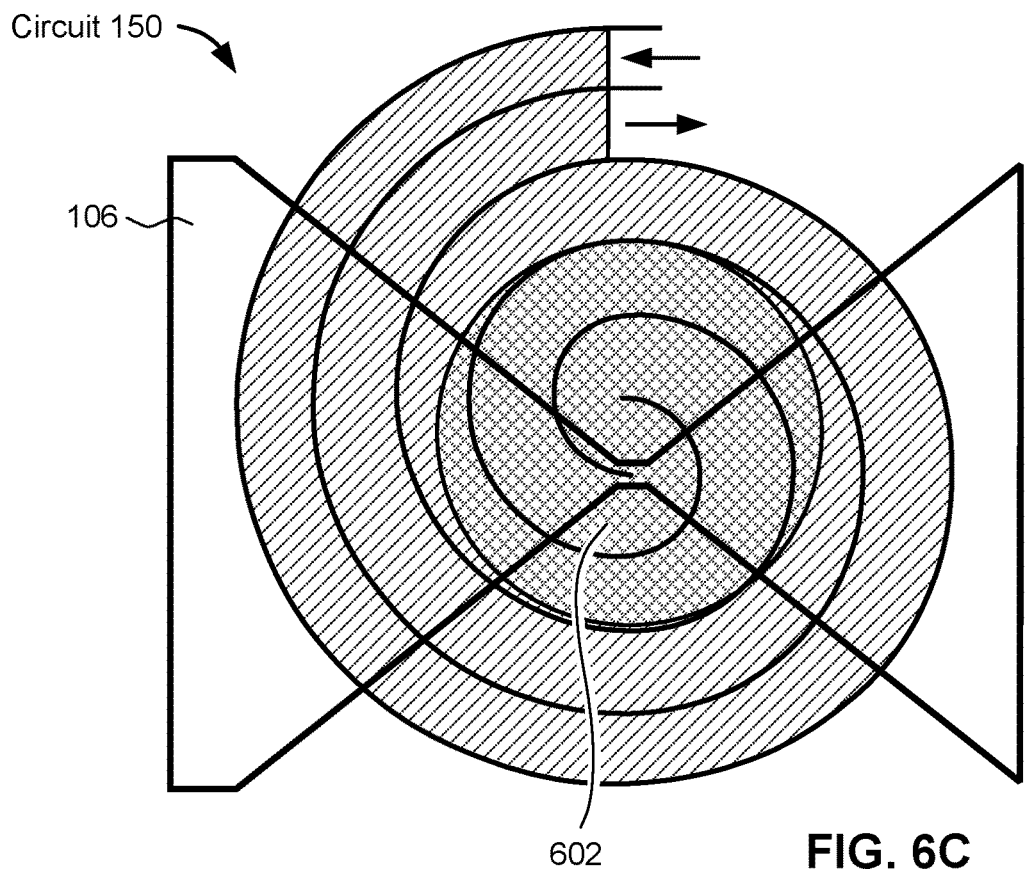
Figure 6D:
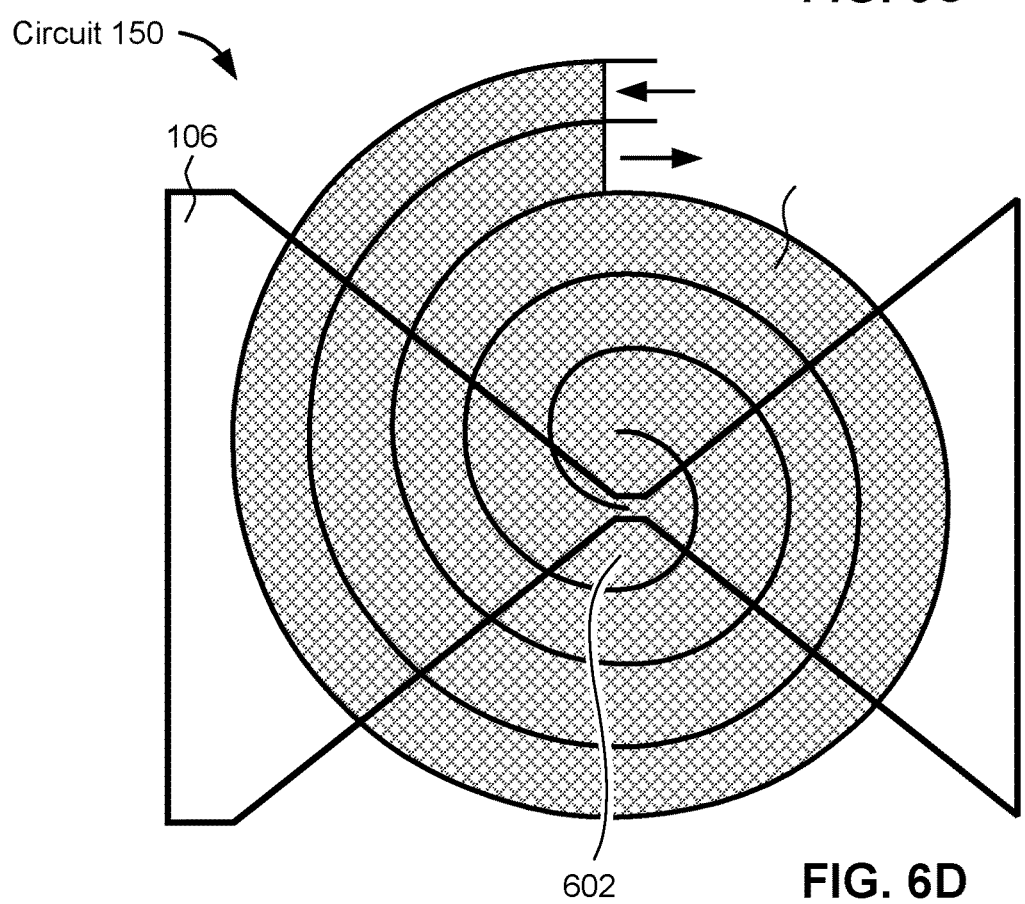

FIGS. 6A-6D illustrate a prophetic operating sequence of the circuit of FIG. 5 in accordance with some embodiments. FIG. 6A shows the circuit 150 at a first time with no heat being generated by the thin section 108 of the gate component 106. FIG. 6B shows the circuit at a second time (e.g., after the first time) with heat being generated by the thin section 108 of the gate component 106 and causing a proximate portion (e.g., non-superconducting portion 602, e.g., a rectangular-shaped portion spanning the width of the superconductor component) of the superconductor component 151 to transition from the superconducting state to a non-superconducting state. In some embodiments, the proximate portion has a length equal to the width of the superconductor component and a width between 5 nm and 20 nm. In some embodiments, the heat transferred from the thin section 108 exceeds a superconducting threshold temperature of the proximate portion of the superconductor component 151, thereby causing the proximate portion to transition to the non-superconducting state. In some embodiments, the heat transferred from the thin section 108 lowers a superconducting threshold current of the proximate portion of the superconductor component 151 such that the current supplied by the current source 104 exceeds the lowered superconducting threshold current, thereby causing the proximate portion to transition to the non-superconducting state. FIG. 6C shows the circuit at a third time, after the second time, where the non-superconducting portion 602 of the superconductor component 151 has expanded beyond the proximate portion, e.g., due to self-heating and thermal-conductivity of the superconductor component 151. FIG. 6D shows the circuit at a fourth time, after the third time, where the non-superconducting portion 602 of the superconductor component 151 has expanded further. Thus, the superconductor component's 151 spiral shape results in a larger non-superconducting portions (as compared to the superconductor 102).

Figure 7A:
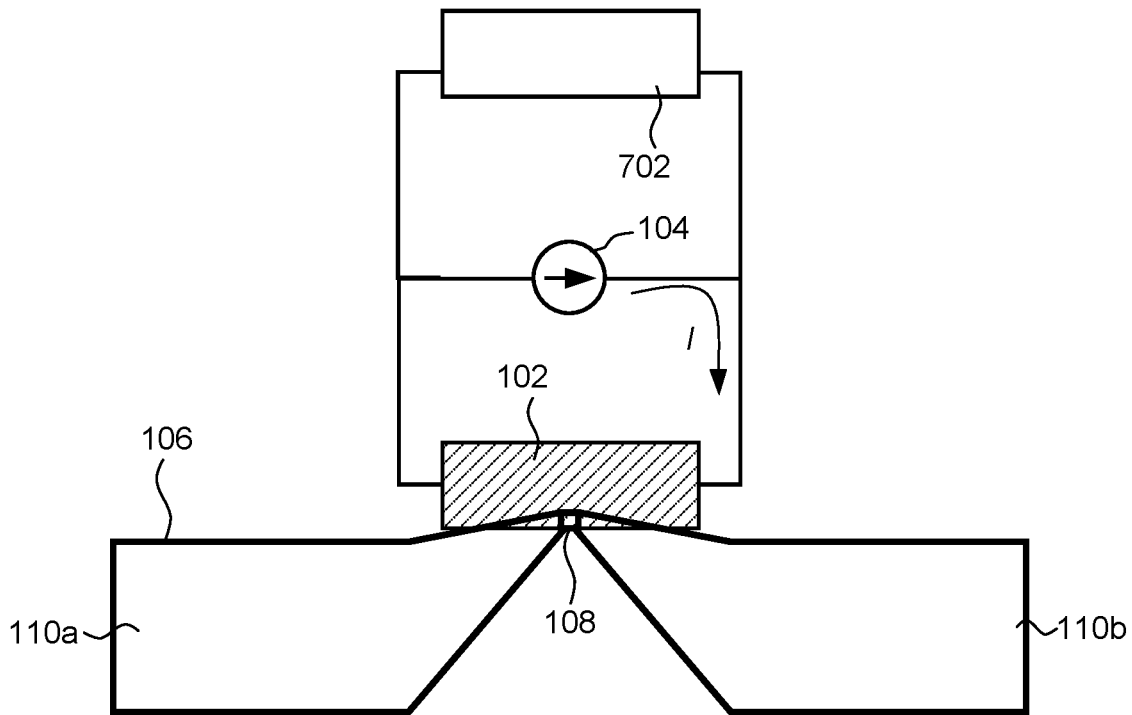
FIGS. 7A-7B illustrate an example of operation of the circuit of FIGS. 1A-1B, in accordance with some embodiments.
Figure 7B:
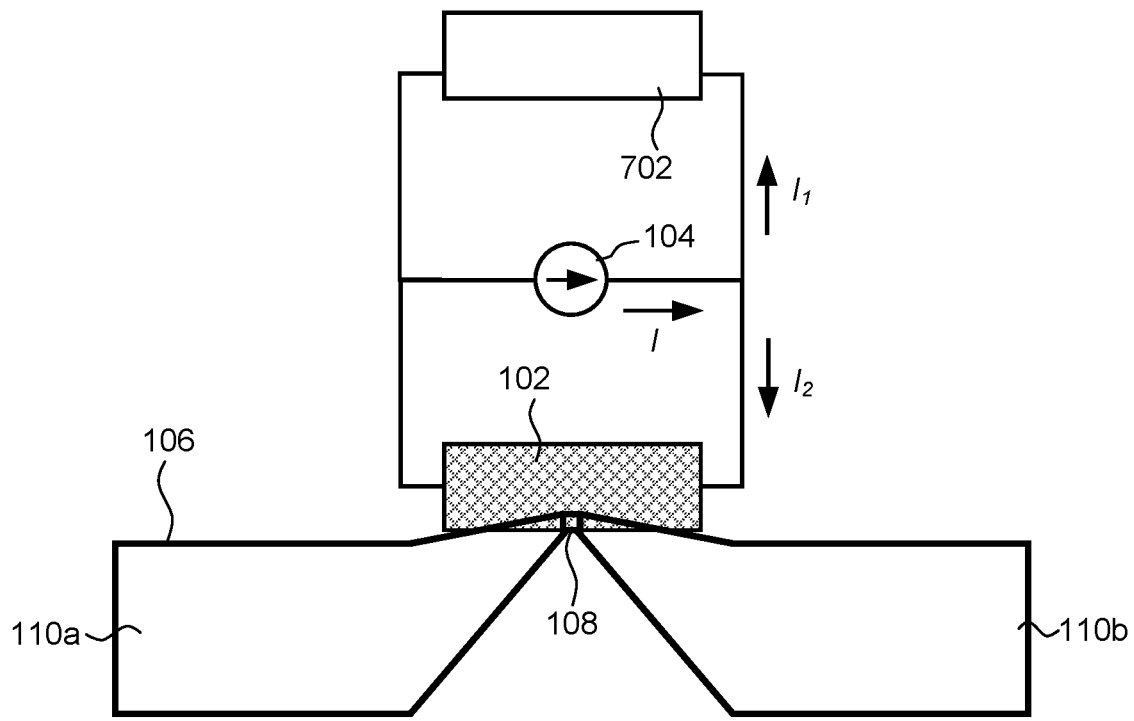

FIGS. 7A-7B illustrate an example of operation of the circuit of FIGS. 1A-1B, in accordance with some embodiments. In some embodiment, a non-superconductor component 702 is coupled in parallel with the superconductor component 102. As shown in FIG. 7A, in some circumstances, when superconductor component 102 is in a superconducting state, substantially all of the current I from the current source is directed through the superconductor component 102. In contrast, in FIG. 7B, when the superconductor component 102 is in a non-superconducting state, at least a portion $I_1$ of the current I is redirected to the non-superconductor component 702 (note that a portion $I_2$ of the current I may still be directed through the superconductor component 102).

In light of these principles and embodiments, we now turn to certain additional embodiments.

In accordance with some embodiments, an electric circuit (e.g., circuit 100, FIGS. 1A-1B) includes: (1) a superconductor component (e.g., the superconductor component 102) having a first terminal at a first end (e.g., the drain of superconductor component 102) and a second terminal at a second end (e.g., the source of the superconductor component 102); and (2) a gate component (e.g., the gate component 106) thermally-coupled to the superconductor component at a first location between the first terminal and the second terminal, where the gate component is thermally-coupled via a first section (e.g., the thin section 108) of the gate component. In some embodiments, the gate component has a smallest width at the first section so as to focus resistive heating toward the superconductor component (e.g., as shown in FIG. 1A). In some embodiments, the electric circuit is configured such that the superconductor component transitions from a superconducting state to a non-superconducting state in response to heat from the gate component.

In some embodiments, the gate component has a first end (e.g., gate in portion 110a of the gate component 106 in FIG. 1A) and a second end (e.g., the gate out portion 110b), opposite the first end, and wherein the gate component is tapered between the first end and the first section and between the second end and the first section (e.g., as illustrated in FIG. 1A).

In some embodiments, the first end of the superconductor component is opposite of the second end, and the first location is or includes an edge portion of the superconductor component between the first end and the second end. For example, the thin section 108 is positioned over an edge portion of the superconductor component 102 in FIG. 1A.

In some embodiments, the gate component is separated from the superconductor component by an electrically-insulating, thermally-conductive coupling component (e.g., composed of aluminum nitride (AlN)). In some embodiments, the electric circuit includes: (1) a first layer with the superconductor component; (2) a second layer with the gate component; and (3) a third layer arranged between the first layer and the second layer, third layer having a thermal-coupling component. In some embodiments, the first, second, and third layers are vertically stacked, e.g., with the first layer on the bottom and the second layer on the top (or vice versa).

In some embodiments, the gate component has a non-zero resistance. In some embodiments, the gate component is composed of a metal or a semiconducting material.

In some embodiments, the circuit further includes a first current source (e.g., current source 104) coupled to the superconductor component, the first current source configured to supply a first current to the superconductor component. In some embodiments, the first current is adapted to maintain the superconductor component in a superconducting state in the absence of heat from the gate component.

In some embodiments, the circuit further includes a non-superconductor component coupled with the superconductor component (e.g., in parallel) such that at least a portion of the first current is redirected to the non-superconductor component while the superconductor component is in a non-superconducting state. In some embodiments, the non-superconductor component is configured to have a resistance that is less than a resistance of the superconductor component in the non-superconducting state.

In some embodiments, the circuit further includes a second current source coupled to the gate component, the second current source configured to selectively supply a second current, where the second current is adapted so as to cause the gate component to generate sufficient heat at the first section to cause the superconductor component to transition from a superconducting state to a non-superconducting state (e.g., as illustrated in FIG. 2A).

In some embodiments, the superconductor component includes a constricted portion (e.g., the constricted region 112 in FIG. 3) between the first terminal and the second terminal. In some embodiments, the first location is within the constricted portion. For example, the thin section 108 of the gate component 106 is proximate to constricted region 112 of the superconductor component 102 in FIG. 3. In some circumstances and implementations, the constricted portion causes current crowding effects at the first location thereby reducing an amount of heat needed to transition to the non-superconducting state.

In some embodiments, the superconductor component is shaped so as to promote self-heating in response to the first location transitioning to the non-superconducting state (e.g., a spiral shape as illustrated in FIG. 5).

In some embodiments, the superconductor component is arranged in a spiral shape between the first terminal and the second terminal (e.g., as shown in FIG. 5). In some embodiments, the first location is within a center portion of the spiral shape. For example, the thin section 108 of the gate component 106 is proximate to a center portion of the spiral shape in FIG. 5. In some circumstances and implementations, the spiral shape of the superconductor component promotes heat spread (e.g., via self-heating) throughout the superconductor component thereby increasing an amount of the superconductor component that transitions to the non-superconducting state in response to heat from the gate component.

It will also be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

As used herein, a "superconducting circuit" or "superconductor circuit" is a circuit having one or more superconducting materials. For example, a superconductor switch circuit is a switch circuit that includes one or more superconducting materials. As used herein, a "superconducting" material is a material that is capable of operating in a superconducting state (under particular conditions). For example, a superconducting material is a material that operates as a superconductor (e.g., operates with zero electrical resistance) when cooled below a particular temperature (e.g., a threshold temperature) and having less than a threshold current flowing through it. A superconducting material is also sometimes called herein a superconduction-capable material. In some embodiments, the superconducting materials operate in an "off" state where little or no current is present. In some embodiments, the superconducting materials can operate in a non-superconducting state during which the materials have a non-zero electrical resistance (e.g., a resistance in the range of one thousand to ten thousand ohms). For example, a superconducting material supplied with a current greater than a threshold superconducting current for the superconducting material transitions from a superconducting state having zero electrical resistance to a non-superconducting state having non-zero electrical resistance. As an example, superconducting layer 118 is a layer that is capable of operating in a superconducting state (e.g., under particular operating conditions).

As used herein, a "wire" is a section of material configured for transferring electrical current. In some embodiments, a wire includes a section of material conditionally capable of transferring electrical current. For example, a wire made of a superconducting material is capable of transferring electrical current while the wire is maintained at a temperature below a threshold temperature. As another example, a wire made of semiconducting material is capable of transferring electrical current while the wire is maintained at a temperature above a freeze-out temperature. A cross-section of a wire (e.g., a cross-section that is perpendicular to a length of the wire) optionally has a regular (e.g., flat or round) shape or an irregular shape. While some of the figures show wires having rectangular shapes, any shape could be used. In some embodiments, a length of a wire is greater than a width or a thickness of the wire (e.g., the length of a wire is at least 5, 6, 7, 8, 9, or 10 times greater than the width and the thickness of the wire). In some cases, a wire is a section of a superconducting layer.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An electric circuit, comprising:
a superconductor component having a first terminal at a first end and a second terminal at a second end;
a thermally-conductive coupling component coupled to the superconductor component at a first location between the first terminal and the second terminal, wherein the thermally-conductive coupling component is composed of an electrically-insulating material; and
a gate component configured to generate a resistive heat that exceeds a superconducting threshold temperature of the superconductor component, wherein the gate component is thermally-coupled to the thermally-conductive coupling component via a first section of the gate component; and
wherein the gate component has a smallest width at the first section so as to focus resistive heating toward the superconductor component, and the gate component is separated from the superconductor component by the thermally-conductive coupling component.

2. The circuit of claim 1, wherein the gate component has a first end and a second end, opposite the first end, and wherein the gate component is tapered between the first end and the first section and between the second end and the first section.

3. The circuit of claim 1, wherein the first end of the superconductor component is opposite of the second end, and wherein the first location comprises an edge portion of the superconductor component between the first end and the second end.

4. The circuit of claim 1, wherein the gate component has a non-zero resistance.

5. The circuit of claim 1, wherein the electric circuit includes:
a first layer comprising the superconductor component;
a second layer comprising the gate component; and
a third layer arranged between the first layer and the second layer, third layer comprising the thermally-conductive coupling component.

6. The circuit of claim 5, wherein the first, second, and third layers are vertically stacked.

7. The circuit of claim 1, further comprising a first current source coupled to the superconductor component, the first current source configured to supply a first current to the superconductor component.

8. The circuit of claim 7, wherein the first current is adapted to maintain the superconductor component in a superconducting state in the absence of heat from the gate component.

9. The circuit of claim 7, further comprising a non-superconductor component coupled in parallel with the superconductor component such that at least a portion of the first current is redirected to the non-superconductor component while the superconductor component is in a non-superconducting state.

10. The circuit of claim 1, further comprising a second current source coupled to the gate component, the second current source configured to selectively supply a second current, wherein the second current is adapted so as to cause the gate component to generate sufficient heat at the first section to cause the superconductor component to transition from a superconducting state to a non-superconducting state.

11. The circuit of claim 1, wherein the superconductor component includes a constricted portion between the first terminal and the second terminal;
wherein the first location is within the constricted portion;
whereby the constricted portion causes current crowding effects at the first location, thereby reducing an amount of heat needed to transition to a non-superconducting state.

12. The circuit of claim 1, wherein the superconductor component is shaped so as to promote self-heating in response to the first location transitioning to a non-superconducting state.

13. The circuit of claim 1, wherein the superconductor component is arranged in a spiral shape between the first terminal and the second terminal;
wherein the first location is within a center portion of the spiral shape;
whereby the spiral shape of the superconductor component promotes heat spread throughout the superconductor component thereby increasing an amount of the superconductor component that transitions to a non-superconducting state in response to heat from the gate component.

14. An electric circuit, comprising:
a superconductor component having a first terminal at a first end and a second terminal at a second end;
a thermally-conductive coupling component thermally coupled to the superconductor component, wherein the thermally-conductive coupling component is composed of an electrically-insulating material; and
a gate component configured to generate a resistive heat that exceeds a superconducting threshold temperature of the superconductor component, wherein the gate component is thermally-coupled to the thermally-conductive coupling component; and
wherein the gate component is separated from the superconductor component by the thermally-conductive coupling component.

15. The circuit of claim 14, wherein the gate component has a first end and a second end, opposite the first end, the gate component is coupled to the thermally-conductive coupling component via a first section, and the gate component is tapered between the first end and the first section and between the second end and the first section.

16. The circuit of claim 14, wherein the first end of the superconductor component is opposite of the second end, the superconductor component is coupled to the thermally-conductive coupling component via a first location, and the first location comprises an edge portion of the superconductor component between the first end and the second end.

17. The circuit of claim 14, wherein the gate component has a non-zero resistance.

18. The circuit of claim 14, wherein the electric circuit includes:
a first layer comprising the superconductor component;
a second layer comprising the gate component; and
a third layer arranged between the first layer and the second layer, third layer comprising the thermally-conductive coupling component.

19. The circuit of claim 18, wherein the first, second, and third layers are vertically stacked.

20. The circuit of claim 18, wherein the superconductor component is arranged in a spiral shape between the first terminal and the second terminal.

21. The circuit of claim 18, wherein the superconductor component is shaped so as to promote self-heating in response to transitioning to a non-superconducting state.

* * * * *